United States Patent [19]

Nagano

[11] Patent Number: 4,484,091
[45] Date of Patent: Nov. 20, 1984

[54] EXCLUSIVE-OR CIRCUIT

[75] Inventor: Katsumi Nagano, Shimonoseki, Japan

[73] Assignee: Tokyo Shibaura Denki Kabushiki Kaisha, Japan

[21] Appl. No.: 396,660

[22] Filed: Jul. 9, 1982

[30] Foreign Application Priority Data

Jul. 10, 1981 [JP] Japan ............................... 56-107688

[51] Int. Cl.³ .................... H03K 19/21; H03K 19/091
[52] U.S. Cl. .................................... 307/471; 307/291; 307/459
[58] Field of Search ............... 307/459, 471, 477, 291; 357/92

[56] References Cited

U.S. PATENT DOCUMENTS 4,065,680 12/1977 Russell ............................... 307/477
4,160,173 7/1979 Aoki ................................. 307/459 X
4,203,042 5/1980 Le Can et al. ................... 307/471 X
4,338,619 7/1982 Miyake et al. ................... 307/459 X

FOREIGN PATENT DOCUMENTS 55-91161 7/1980 Japan ................................. 307/459

Primary Examiner—Larry N. Anagnos
Assistant Examiner—David R. Hudspeth
Attorney, Agent, or Firm—Finnegan, Henderson, Farabow, Garrett & Dunner

[57] ABSTRACT

Two flip-flop circuits are employed to provide a positive output and an its inversion output so as to produce the inverted signal of an input signal necessary to provide the function of an exclusive-OR circuit.

4 Claims, 11 Drawing Figures

F I G. 9
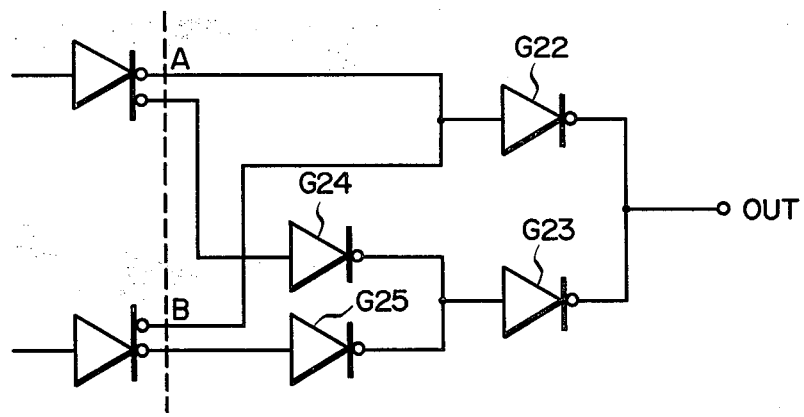

EXCLUSIVE-OR CIRCUIT

BACKGROUND OF THE INVENTION

The present invention relates to an exclusive-OR circuit adapted for use, for example, in a circuit for driving a pulse motor.

The most fundamental exclusive-OR circuit is composed, as shown in FIG. 1, of inverters N1, N2, AND gates A1, A2 and an OR gate O.

The output OUT of the exclusive-OR circuit thus constructed can be represented as below by using inputs A and B.

$$OUT = A\bar{B} + \bar{A}B = A \oplus B$$

FIG. 2 shows an exclusive-OR circuit which employs integrated-injection logic (I²L) circuits operating fundamentally as an inverter.

The inputs A and B are respectively inverted by I²L gates G1 and G2 having multiple-collector outputs. A first output of gate G1 is short-circuited with the output of a gate G3 having its input connected to a first output of gate G2 to provide a wired-AND function. The logical formula at the connecting point of the outputs of gates G1 and G3 is represented as below.

$$X = \bar{A}B$$

Similarly, a second output of gate G2 is short-circuited with the output of a gate G4 having its input connected to a second output of gate G1 to provide a wired-AND function.

The logical formula at the connecting point of the outputs of gates G2 and G4 is represented as below.

$$Y = A\bar{B}$$

I²L gates G5, G6, G7 form an OR circuit. Therefore, the logical formula at the output is given by $$OUT = \bar{A}B + A\bar{B}$$

The logical multiplication function and the logical sum function of the circuit of FIG. 2 are achieved by employing the property of a logic current of open collector output type. The I²L gate is an example of the open-collector-output logic circuits.

As described above, the conventional exclusive-OR circuit necessitates five logic gates G3 to G7.

SUMMARY OF THE INVENTION

It is an object of the present invention to provide an exclusive-OR circuit which can be composed of a lesser number of elements.

The above object of the present invention is achieved by using two flip-flop circuits, as two input signal sources, each of which provides complementary outputs necessary to provide an exclusive-OR function.

BRIEF DESCRIPTION OF THE DRAWINGS

FIG. 9 is a circuit diagram of still another embodiment of the invention.

DETAILED DESCRIPTION OF THE PREFERRED EMBODIMENTS

Figure 1:
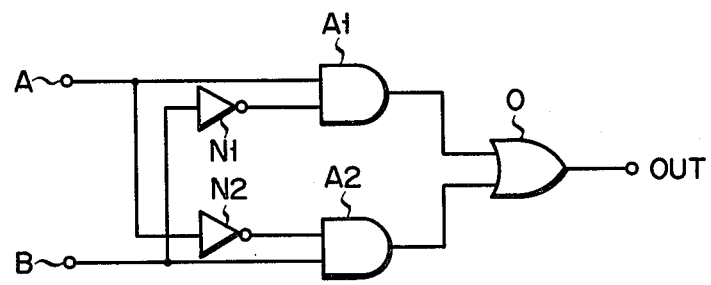
FIGS. 1 and 2 show circuit diagrams of conventional exclusive-OR circuits.
Figure 2:
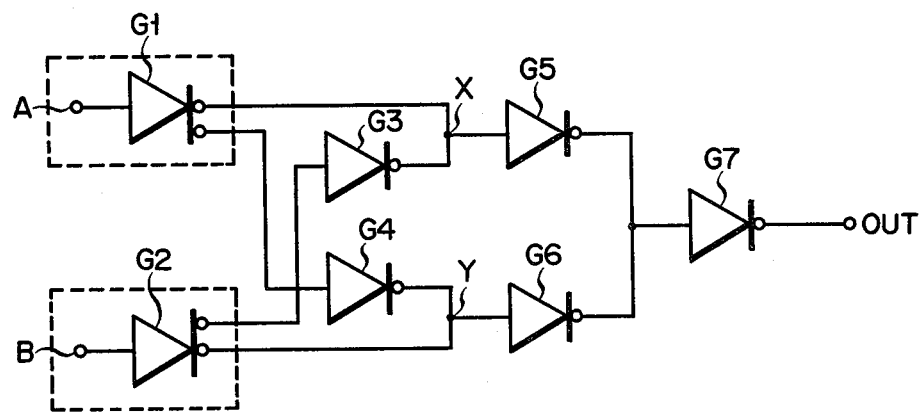
Figure 3A:
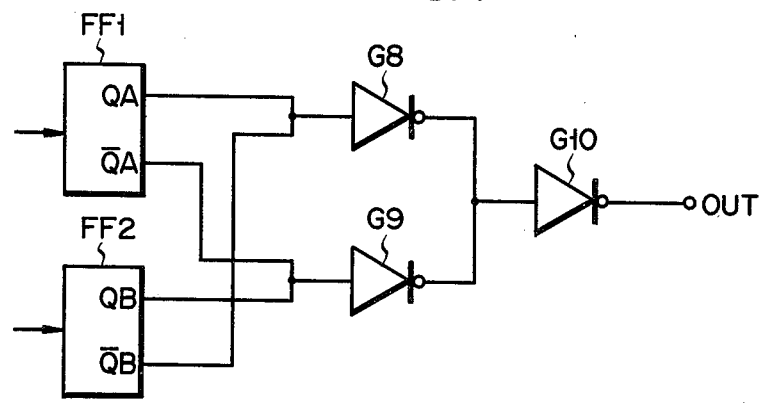
FIG. 3A shows a circuit diagram of an exclusive-OR circuit according to an embodiment of the present invention.

FIG. 3A shows one embodiment of the exclusive-OR circuit according to the present invention. The outputs of flip-flop circuits FF1, FF2 are used as inputs of the exclusive-OR circuit. Since each of the flip-flop circuits provides a pair of complementary outputs, the gates G3, G4 of FIG. 2 can be eliminated.

The flip-flop circuits FF1, FF2 are composed of open collector circuits, e.g., I²L gates. The output $Q_A$ of flip-flop circuit FF1 is short-circuited with the output $\bar{Q}_B$ of flip-flop circuit FF2 to form a wired-AND circuit. On the other hand, the output $\bar{Q}_A$ of flip-flop circuit FF1 is short-circuited with the output $Q_B$ of flip-flop circuit FF2 to provide a wired-AND circuit. The outputs of two wired-AND circuits are supplied to an OR circuit which is composed of gates G8, G9, G10. Accordingly, it is evident that the circuit in FIG. 3A provides the exclusive-OR function similar to the circuit in FIG. 2.

Figure 3B:
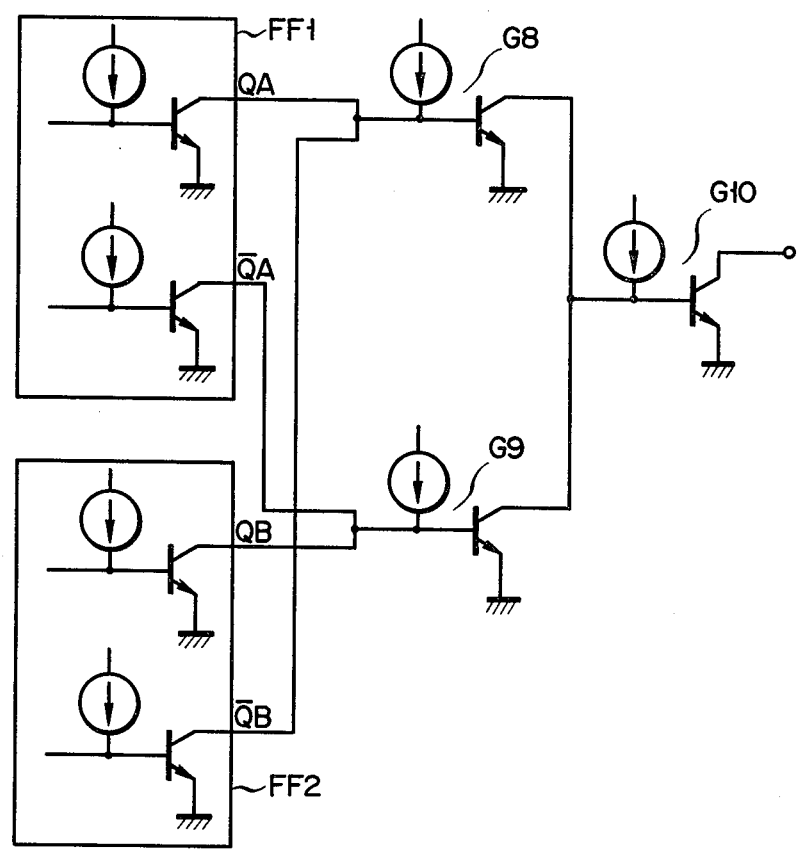
FIG. 3B shows a practical arrangement of the exclusive-OR circuit of FIG. 3A using the integrated-injection logic gates.

The exclusive-OR circuit using flip-flops is advantageously adapted for a circuit for driving a pulse motor, because flip-flop circuits are used in the drive circuit. FIG. 3B shows a practical arrangement of the circuit of FIG. 3A which is composed of I²L gates.

Figure 4:
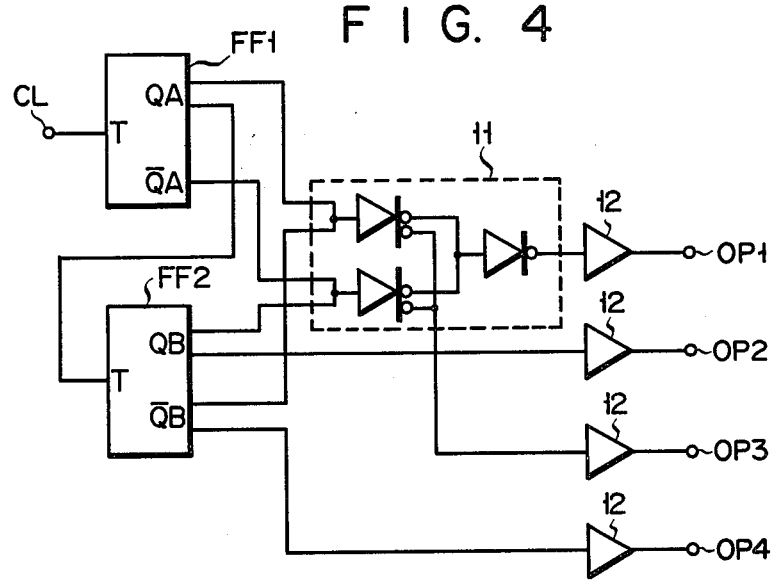
FIG. 4 shows a circuit diagram of 4-phase pulse generating circuit using the exclusive-OR circuit of the invention.

FIG. 4 shows a 4-phase pulse generating circuit which employs the above exclusive-OR circuit and may be used, for example, as a circuit for driving a 4-phase pulse motor. In FIG. 4, FF1, FF2 represent flip-flop circuits which employ I²L circuits, 11 the above exclusive-OR circuit, and 12 a non-inverting buffer circuit.

The flip-flop circuit FF1 is driven by a clock signal CL, and the flip-flop circuit FF2 is driven by the output $Q_A$ of the flip-flop circuit FF1. The outputs of the exclusive-OR circuit 11 and the flip-flop circuit FF2 produce outputs OP1 to OP4 through buffer circuits 12.

The output signals OP1 to OP4 are represented as below.

$$OP1 = Q_A \oplus Q_B$$

$$OP2 = Q_B$$

$$OP3 = \overline{Q_A + Q_B}$$

$$OP4 = \bar{Q}_B$$

Figure 5:
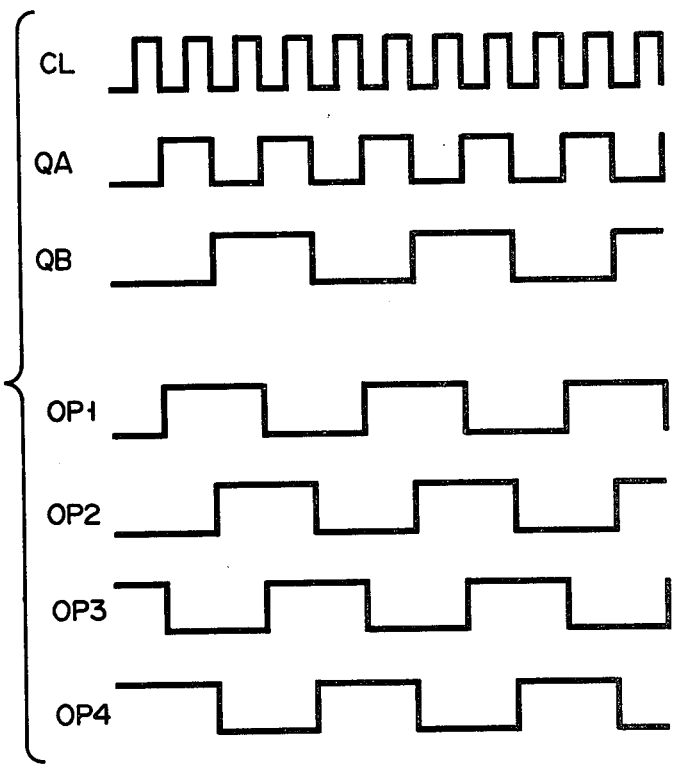
FIG. 5 is a timing chart of the pulse generating circuit of FIG. 4.

FIG. 5 shows the timing chart of the respective signals of the circuit in FIG. 4. The outputs OP1 to OP4 are four-phase pulse signals displaced by 90° in phase from each other, which are used to drive a four-phase pulse motor.

Figure 6:
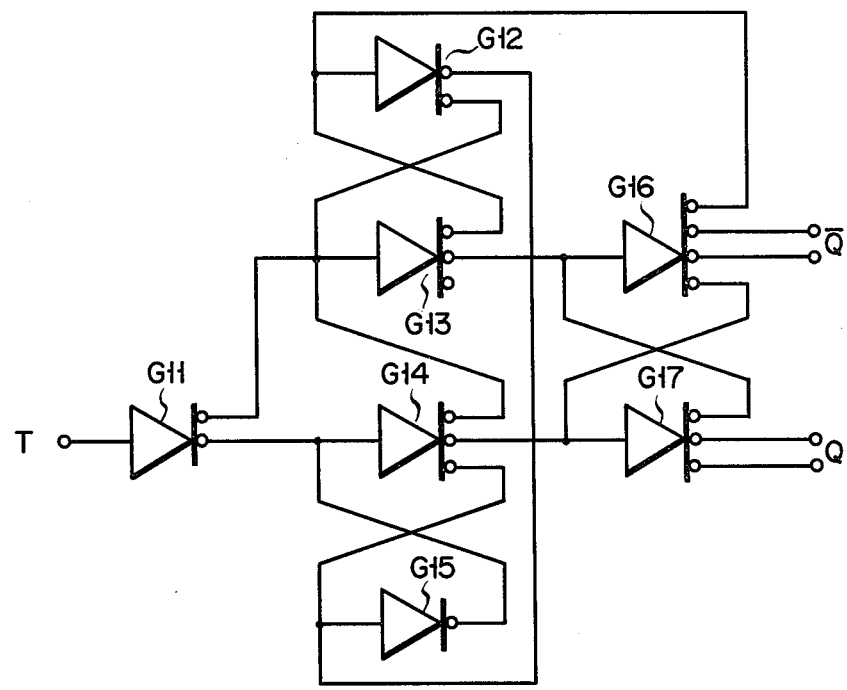
FIG. 6 is a circuit diagram of a flip-flop circuit composed of integrated-injection logic gates.

FIG. 6 shows a practical arrangement of the flip-flop circuits FF1, FF2, which are composed of gates G11 to G17.

Figure 7A:
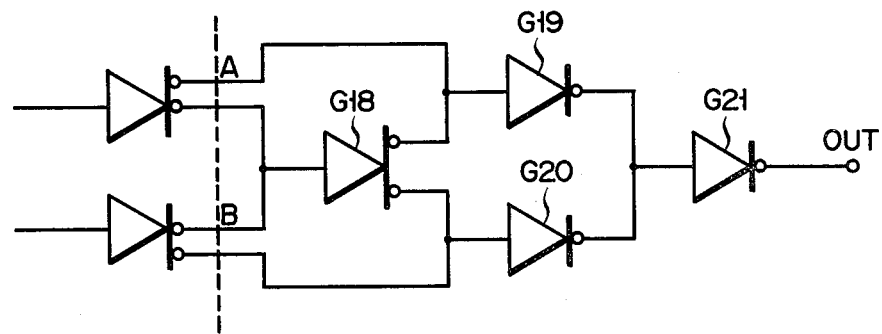
FIG. 7A is a circuit diagram of another embodiment of the present invention.
Figure 7B:
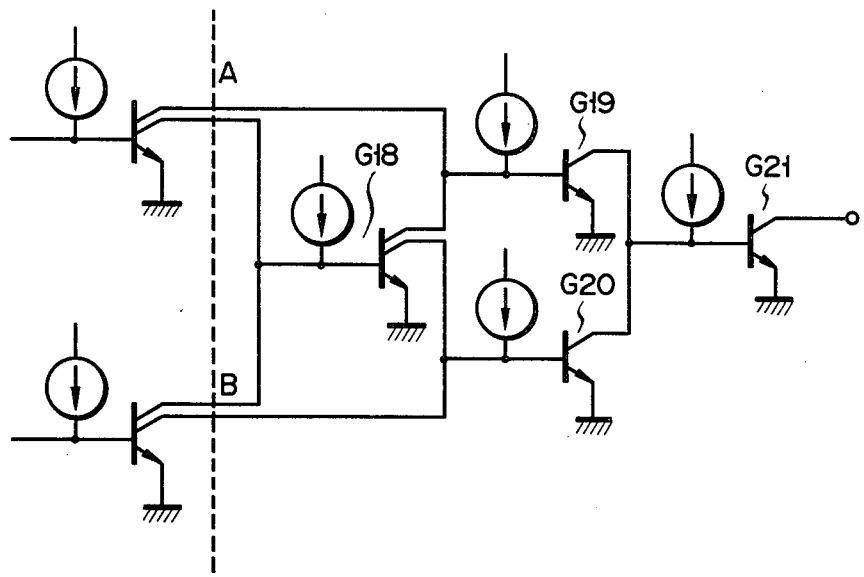
FIG. 7B is a practical arrangement of the circuit in FIG. 7A.

FIGS. 7A and 7B show another embodiment of the invention. This embodiment uses input signals A and B, and an inverted signal is produced by a gate G18. Namely, A·B is inverted by gate G18 to produce $\overline{A \cdot B}$. Further, $\overline{A \cdot B} \cdot A$ and $\overline{A \cdot B} \cdot B$ are supplied to an OR circuit which is composed of gates G19, G20, G21 to provide the exclusive-OR function.

This circuit is composed on the basis of a modification of the logic formula $A\overline{B} + \overline{A}B$ as shown below.

$$A \oplus B = A\overline{B} + \overline{A}B$$
$$= (\overline{A} + \overline{B})A + (\overline{A} + \overline{B})B$$
$$= \overline{\overline{A}B\cdot A} + \overline{\overline{AB}\cdot B}$$

FIG. 7B shows a practical arrangement of the circuit in FIG. 7A.

The above formulae are further modified as below.

$$\overline{\overline{AB}A} + \overline{\overline{AB}B} = \overline{\overline{AB}}(A+B) = \overline{\overline{AB}} \times \overline{(\overline{AB})}$$

Figure 8:
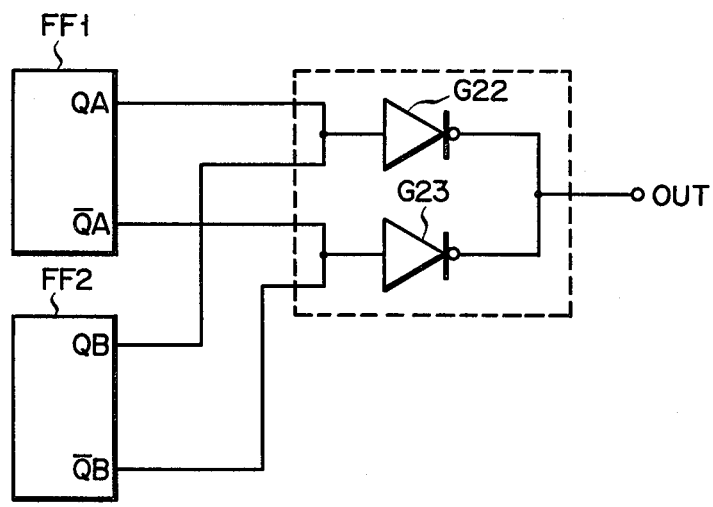
FIG. 8 is a circuit diagram of still another embodiment of the invention.

FIG. 8 shows an exclusive-OR circuit which is based on this modification. Namely, the product of the output $Q_A$ of the flip-flop FF1 and the output $Q_B$ of the flip-flop FF2 is supplied to a gate G22. On the other hand, the product of the output $\overline{Q}_A$ of the flip-flop FF1 and the output $\overline{Q}_B$ of the flip-flop FF2 is supplied to a gate G23. The outputs of the gates G22, G23 are wired-ANDed to provide the exclusive-OR function.

FIG. 9 shows a circuit providing an exclusive-OR function with gates G24, G25 added to the circuit in FIg. 8 and with inputs A and B. Namely, this circuit can be composed of only four gates.

What is claimed is:

1. An exclusive-OR circuit comprising:
    a first flip-flop circuit of an open collector type for providing first and second complementary outputs in response to a pulse input;
    a second flip-flop circuit of an open collector type for providing first and second complementary outputs in response to a pulse input;
    an open collector type first inverter circuit having an input and an output, the input being connected to said first output of said first flip-flop circuit and to said second output of said second flip-flop circuit;
    an open collector type second inverter circuit having an input and an output, the input being connected to said second output of said first flip-flop circuit and to said first output of said second flip-flop circuit; and
    output means connected to the outputs of said first and second inverter circuits for providing a logical NAND function of the output signals of said first and second inverter circuits.

2. The exclusive-OR circuit according to claim 1, wherein the second output of each of said first and second flip-flop circuits is an inverted output of the first output, and said output means comprises an open collector type inverter circuit for producing an inverted product of the outputs of said first and second inverter circuits.

3. The exclusive-OR circuit according to claim 1, wherein the second output of each of said first and second flip-flop circuits is an inverted output of the first output.

4. The exclusive-OR circuit according to claim 1, 2 or 3, wherein said first and second flip-flop circuits and said first and second inverter circuits are each composed of integrated-injection logic gates.

* * * * *